United States Patent
Fetterman et al.

(10) Patent No.: US 9,125,303 B2
(45) Date of Patent: Sep. 1, 2015

(54) POWER SUPPLY INPUT ROUTING

(71) Applicant: Apple Inc., Cupertino, CA (US)

(72) Inventors: Kevin S. Fetterman, Los Altos, CA (US); Kathleen A. Bergeron, Los Gatos, CA (US); John Douglas Field, Los Gatos, CA (US); Edward H. Frank, Atherton, CA (US); Michelle R. Goldberg, Sunnyvale, CA (US); Harsha Lakshmanan, Fremont, CA (US); Manisha P. Pandya, Sunnyvale, CA (US); Bharat K. Patel, San Jose, CA (US); Deborah Claire Sharrah, Santa Clara, CA (US); Steve Xing-Fu Zhou, San Jose, CA (US)

(73) Assignee: Apple Inc., Cupertino, CA (US)

( * ) Notice: Subject to any disclaimer, the term of this patent is extended or adjusted under 35 U.S.C. 154(b) by 188 days.

(21) Appl. No.: 13/889,220

(22) Filed: May 7, 2013

(65) Prior Publication Data

US 2013/0314954 A1  Nov. 28, 2013

Related U.S. Application Data

(60) Provisional application No. 61/651,500, filed on May 24, 2012.

(51) Int. Cl.
*H05K 1/02* (2006.01)
*H02M 7/00* (2006.01)
*H02M 1/12* (2006.01)

(52) U.S. Cl.
CPC .............. *H05K 1/0213* (2013.01); *H02M 1/12* (2013.01); *H02M 7/003* (2013.01); *H05K 1/0218* (2013.01); *H05K 1/0262* (2013.01); *H05K 2201/0715* (2013.01); *H05K 2201/09309* (2013.01); *H05K 2201/10409* (2013.01)

(58) Field of Classification Search
CPC ...... H02M 1/12; H02M 7/003; H05K 1/0206; H05K 1/0393; H05K 1/092; H05K 3/429; H01L 23/4006; H01L 2924/14; H01L 23/4093
USPC .......................... 363/39, 147; 174/252–260; 361/716–722, 792, 794, 795
See application file for complete search history.

(56) References Cited

U.S. PATENT DOCUMENTS

| | | | | |
|---|---|---|---|---|
| 3,405,227 A * | 10/1968 | Hazlett | ................... | 174/252 |
| 4,037,047 A * | 7/1977 | Taylor | ................... | 174/254 |
| 5,990,776 A * | 11/1999 | Jitaru | ................... | 336/200 |
| 6,441,313 B1 * | 8/2002 | Novak | ................... | 174/255 |
| 7,161,088 B2 | 1/2007 | Nicolaisen | | |
| 8,066,407 B2 | 11/2011 | Remus et al. | | |
| 8,228,027 B2 | 7/2012 | Gao | | |
| 8,895,863 B2 * | 11/2014 | Inaba et al. | ................... | 174/252 |
| 2010/0096266 A1 | 4/2010 | Kim et al. | | |

* cited by examiner

*Primary Examiner* — Adolf Berhane
(74) *Attorney, Agent, or Firm* — Downey Brand LLP

(57) ABSTRACT

One embodiment of a power supply input routing apparatus can include a multilayer printed circuit board configured to accept only an alternating current (AC) line voltage, return and ground signals. The AC power jumper board can advantageously route AC power from one section of the power supply to another without burdening the power supply design with extra layer requirements or negatively increasing power supply area. Embodiments including an electronic device having a power supply as above are also disclosed.

20 Claims, 4 Drawing Sheets

POWER SUPPLY INPUT ROUTING

CROSS-REFERENCE TO RELATED APPLICATIONS

The present application claims the benefit under 35 U.S.C. 119(e) of U.S. Prov. Pat. Appl. No. 61/651,500, entitled "POWER SUPPLY INPUT ROUTING," by Kathleen A. BERGERON, et al. filed on May 24, 2012, the contents of which are hereby incorporated herein by reference, in their entirety, for all purposes.

FIELD OF THE DESCRIBED EMBODIMENTS

The described embodiments relate generally to power supplies and more particularly to routing input signals for power supplies.

BACKGROUND

Power supplies generally accept alternating current (AC) main inputs and process AC voltage to produce one or more direct current (DC) voltages. Such power supplies can form the backbone of many electronic devices such as digital video disk (DVD) players, television sets, monitors, personal computing devices and more.

Electronic devices are constantly changing to meet the needs of the user. For example, users can desire more functionality from their devices while also desiring smaller form factors. Dense power supply designs can have relatively difficult design requirements. Dense power supplies can, for example, generate more heat in a unit volume compared to less dense power supply designs. Further, increased heat generation can require more airflow to keep components cool in the power supply.

As power supply designs decrease in size, another design challenge can be related to handling AC input voltage. Oftentimes, because of size constraints, AC input voltage cannot be routed internally through a printed circuit board (PCB). Regulatory requirements (Underwriter Labs, for example) can specify required trace or component clearances from AC signal traces that can increase space requirements and force a larger power supply design. Indiscriminate additions of connectors or other components to handle AC input voltages can impede important air flow as well as increase costs.

Therefore, what is desired is a relatively compact way to route AC input voltage for power supply designs that can use space efficiently and allow effective cooling of the power supply and the electronic device.

SUMMARY

In a first embodiment an apparatus for routing input alternating current (AC) power for a power supply including a multilayer printed circuit board affixed to the power supply with a first end and a second end is provided. The apparatus is configured to receive the AC power signals at the first end and convey the AC power signals to the second end. In some embodiments the multilayer printed circuit board may include a first conductive layer to convey a first AC power signal, a second conductive layer to convey a second AC power signal, and a third conductive layer configured to convey a ground signal.

In a second embodiment a power supply for an electric device including a jumper board, an 'Alternate Current' (AC) input, a 'direct current' (DC) output, and an input power cable is provided. Accordingly, the jumper board may include a multilayer printed circuit board affixed to the power supply with a first end and a second end; the jumper board configured to receive the AC power signals at the first end and convey the AC power signals to the second end. In some embodiments the multilayer printed circuit board may include a first conductive layer to convey a first AC power signal, a second conductive layer to convey a second AC power signal, and a third conductive layer configured to convey a ground signal.

In a third embodiment an electronic device may include a plug for accessing an external source of power; a filter coupled to the plug, to reduce Electromagnetic Interference (EMI) inside the electronic device, a power supply, and an electric component. Accordingly, the power supply may include a jumper board, an 'Alternate Current' (AC) input, a 'direct current' (DC) output, and an input power cable. In further embodiments the jumper board may include a multilayer printed circuit board affixed to the power supply with a first end and a second end, the printed circuit board configured to receive the AC power signals at the first end and convey the AC power signals to the second end. The multilayer printed circuit board may include a first conductive layer to convey a first AC power signal, a second conductive layer to convey a second AC power signal, and a third conductive layer configured to convey a ground signal.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

In the figures, elements having the same or similar reference numerals have same or similar functionality.

DETAILED DESCRIPTION OF SELECTED EMBODIMENTS

Representative applications of methods and apparatus according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

Power supply designs can receive AC power (also commonly referred to as AC line signals AC main or simply mains voltages), process it, and produce one or more DC output voltages. AC power signals can vary with implementation and geographic region. For example, AC power is commonly 120 volts in North America, 240 volts in Europe and 100 volts in Japan. Due to end unit device implementation specifics, power supply design details, cooling requirements etc., AC power can be presented to the power supply at a position within an electrical device that can negatively affect power supply design. For example, AC power can be available only at a region of the power supply relatively distant from AC processing circuits. One embodiment for conveying AC power can use a separate AC jumper PCB. The separate board can be configured to handle AC current in accordance with design constraints such as AC current requirements of the power supply. The separate board can also be configured to save volume (space) and maintain air flow for cooling.

Figure 1:
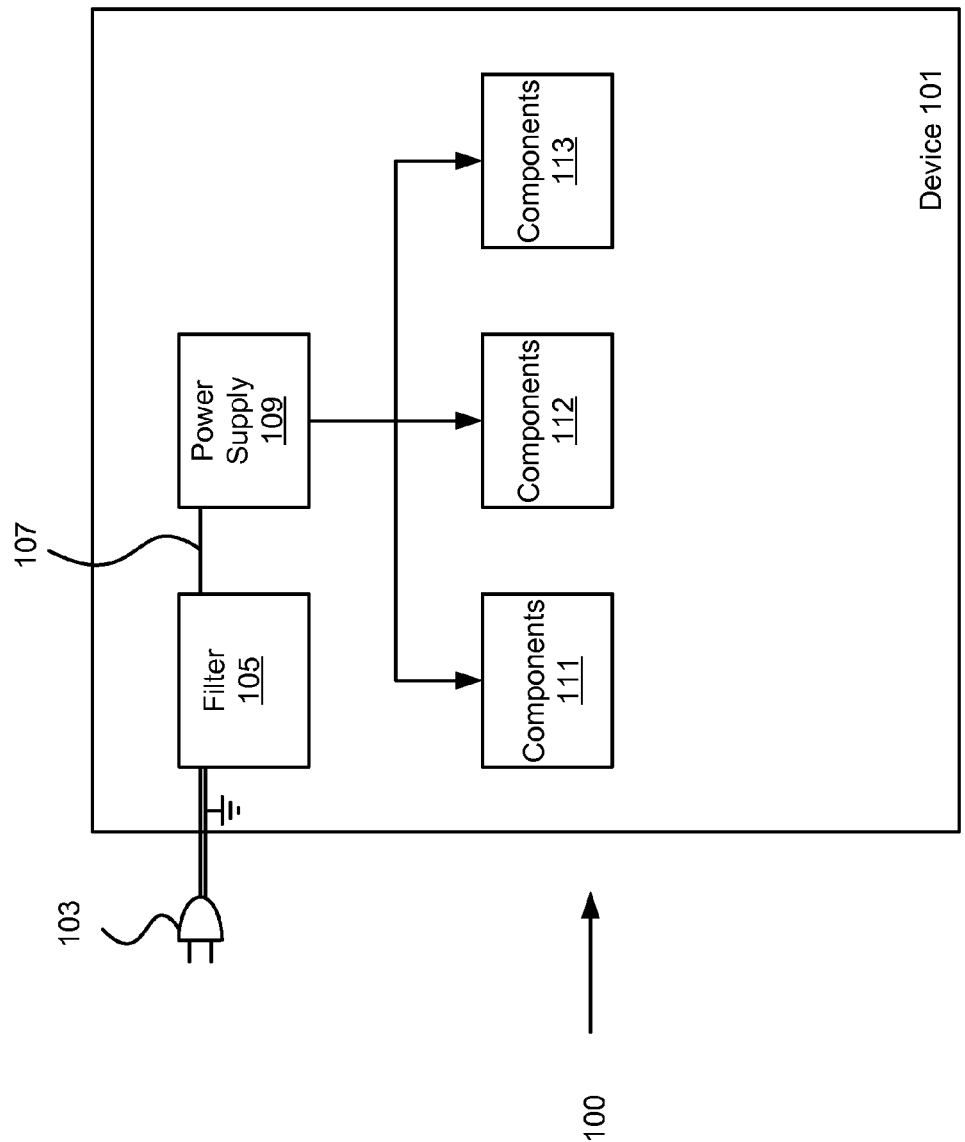
FIG. 1 is a block diagram of one embodiment of an electrical device with a power supply in accordance with one embodiment described in the specification.

FIG. 1 is a block diagram of one embodiment 100 of an electrical device 101 with a power supply 109 in accordance with one embodiment described in the specification. The electrical device can be a computing device, a mobile computing device, a server, a storage disk array, a video monitor or any other suitable electrical device 101 including a power supply 109. Power supply 109 can receive AC power and produce one or more DC output voltages. Power supply 109 can be a linear regulated supply or a switching regulated power supply. In some embodiments, power supply 109 can be a hybrid and include both linear and switching power supply portions. AC power can enter electrical device 101 from plug 103. In one embodiment, plug 103 can receive three signals, line (also referred to as "hot" or power), neutral and ground. In some embodiments, when AC power enters electrical device 101, ground can be terminated to a point on a chassis or case of electrical device 101. Plug 103 may be a wall plug, or a three-pronged wall plug, as well known in the art.

FIG. 1 also illustrates a filter 105. AC power can enter electrical device 101 through filter 105. In some embodiments, filter 105 can be an Electromagnetic Interference (EMI) filter that reduces conducted EMI signals outside of electrical device 101. AC power can be coupled from filter 105 to power supply 109. Power supply 109 can convert AC power to a DC output voltage. In some embodiments, power supply 109 can provide two or more DC output voltages. DC power from power supply 109 can be coupled to components 111, 112 and 113 within electrical device 101. Components 111-113 can be an electronic component including computing components such as a processor, a memory, hard drives or any other electrical components such as battery charging circuit, a display, an analog processor, a digital processor, a digital to analog converter and the like. FIG. 1 shows three components 111, 112, and 113 in electrical device 101 for illustrative purposes only. One of ordinary skill may recognize that any number of components may be incorporated and driven by power supply 109 in electrical device 101.

Figure 2:
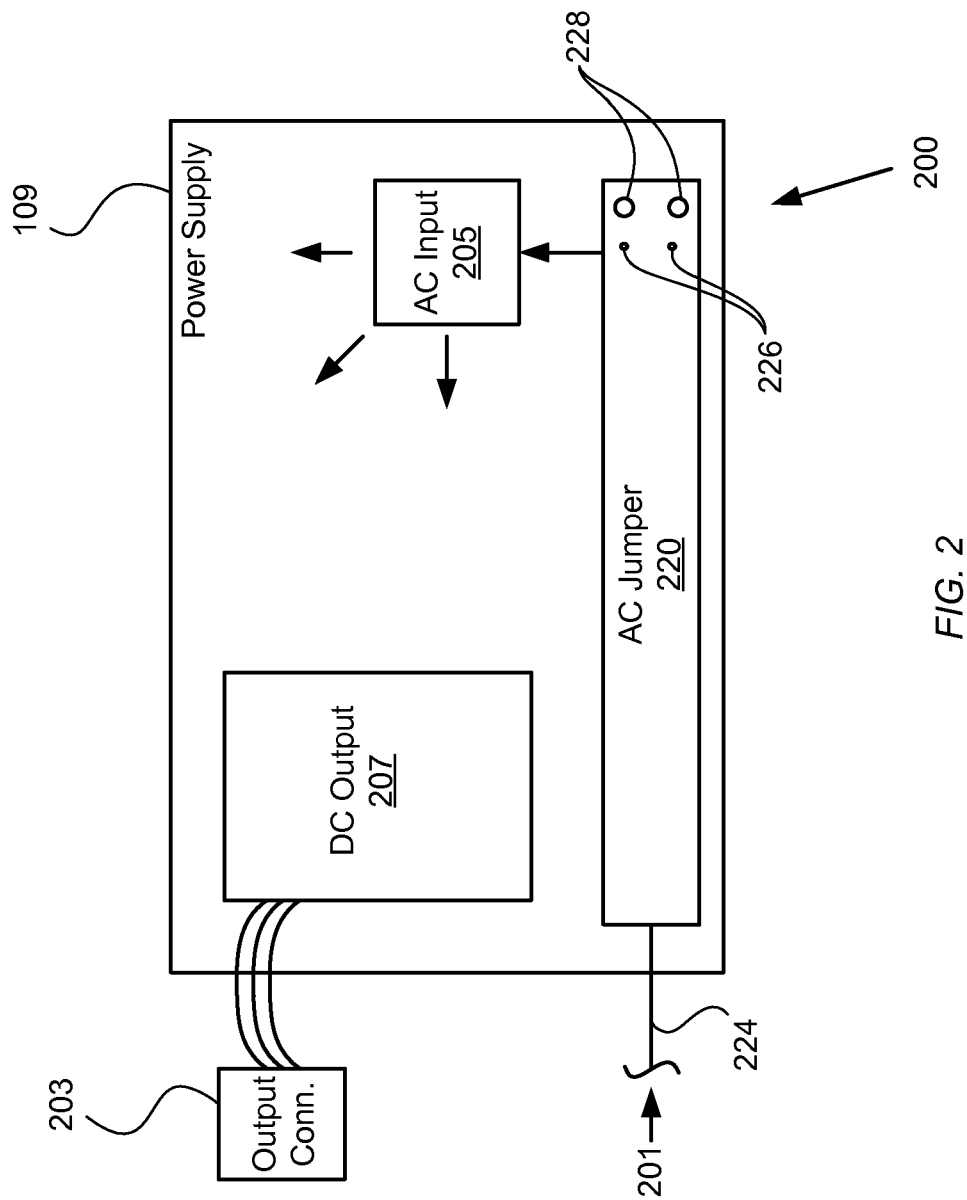
FIG. 2 is a block diagram of a power supply in accordance with one embodiment described in the specification.

FIG. 2 is a block diagram 200 of power supply 109 in accordance with one embodiment described in the specification. Power supply 109 can receive AC power 201 and convert the power to one or more DC output voltages presented at output connector 203. Some power supply designs can be optimized such that specific regions of the power supply can be dedicated for specific purposes. For example, one region of power supply 109 can be used to process AC power, while another region can handle final regulation of DC output power.

In some embodiments, the layout of regions of power supply 109 may be determined, at least in part, by functionality and design constraints of electrical device 101. In power supply 109, AC input processing circuits 205 can receive AC power, process it and distribute AC processed power to other regions of power supply 109. For example, AC input processing region 205 can process the AC input for power factor correction. A separate region of power supply 109 can be a DC output region 207 that can provide final voltage regulation for one or more output voltages for distribution beyond power supply 109. For example, output voltages can be made available through output connector 203.

As shown, AC power 201 can be available in any portion within power supply 109. In the example of FIG. 2, AC power 201 is available at the left side of power supply 109, while AC input processing circuits 205 can be at the right side of power supply 109. Embodiments consistent with the present disclosure provide AC line power within a power supply PCB while fulfilling safety and regulatory norms, regardless of the area where AC input 205 is located. In one embodiment, AC jumper board 220 can be used to convey AC power to any region of power supply 109 without otherwise burdening the basic power supply 109 PCB with extra area, fiberglass or copper requirements.

AC jumper board 220 can provide 'hot' and 'neutral' power signals from AC input power cable 224 coupled to pins 226. Input power cable may include AC wires specifically designed to carry an AC power signal. In one embodiment, AC jumper board 220 can be formed as a multilayer PCB and can include dedicated layers for 'hot' and 'neutral' signals. Coupling pins 226 can couple signals from AC jumper board 220 to AC input processing region 205. In one embodiment, AC jumper board 220 can be mounted substantially parallel to power supply 109 with a mounting screw 228. In other embodiment, AC jumper board 220 can include ground planes that can be coupled to a ground signal on power supply 109 through mounting screws 228. In that regard, mounting screws 228 may include an electrically conductive material such as aluminum, copper, tin, or other metal or metal alloy.

Figure 3:
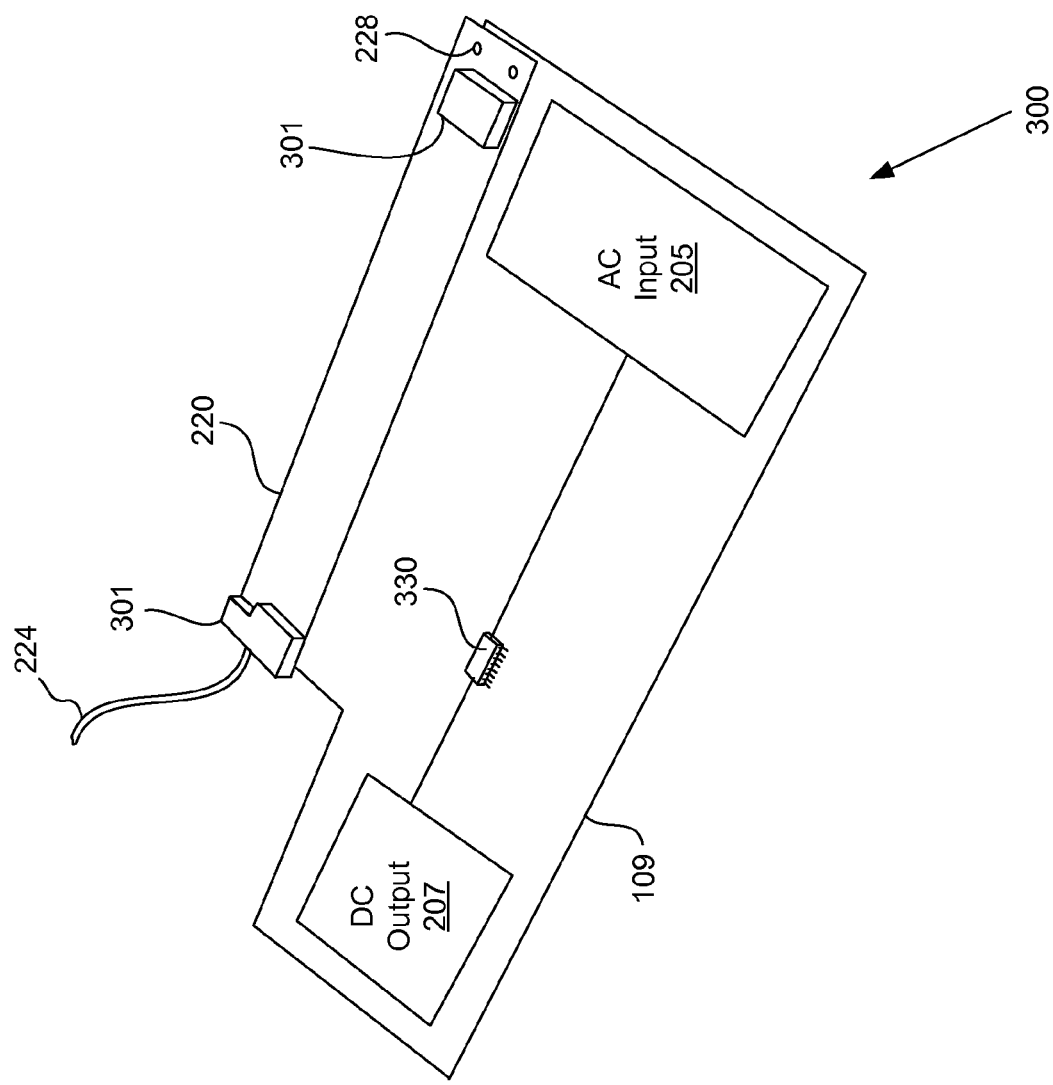
FIG. 3 is view of AC jumper board affixed to power supply, in accordance with one embodiment described in the specification.

FIG. 3 is a perspective view of AC jumper board 220 affixed to power supply 109, in accordance with one embodiment described in the specification. Power supply 109 is shown with AC input processing region 205 and DC output region 207. AC wires 224 can convey AC power to power supply 109. In one embodiment, AC wires 224 can land on power supply 109 and be coupled to AC jumper board 220 by coupling pins (not shown). In another embodiment, AC wires can land on AC jumper board 220 directly. AC jumper board 220 can convey AC power to AC input processing circuits 205 and can couple AC power to power supply 109 through coupling pins 226 (not shown, cf. FIG. 2). Coupling pins 226 having high voltages (such as AC power) can be shielded by protective caps 301. Protective caps 301 may insulate the AC power in coupling pins 226 from inadvertently touching by a technician, or from other components in power supply 109.

FIG. 3 also illustrates integrated circuit (IC) 330 coupled to AC input 205, and DC output 207. Accordingly, IC 330 may include a processor circuit and a memory circuit performing functions to monitor and control the operation of power supply 109. For example, IC 330 may monitor and register voltages and currents in different portions of power supply 109. Monitoring voltages and currents in different portions of power supply 109 may avoid damaging delicate circuitry inside power supply 109, or damaging any of the components 111, 112, and 113 in electrical device 101 (cf. FIG. 1). In some embodiments, IC 330 may monitor and register the temperature in different portions of power supply 109 to avoid critical situations such as overheating.

Figure 4:
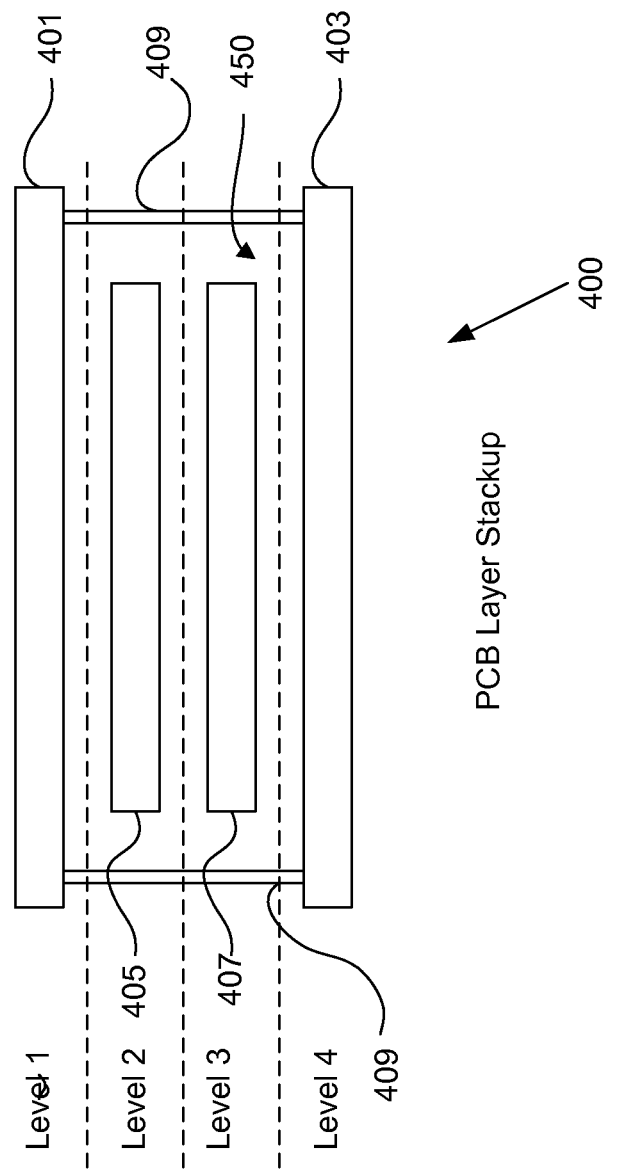
FIG. 4 is a cross sectional view of a layer stack up of the AC jumper board in accordance with one embodiment described in the specification.

FIG. 4 is a cross sectional view of a layer stack-up 400 of AC jumper board 220 in accordance with one embodiment described in the specification. AC jumper board 220 can be implemented as a multilayer PCB. In the embodiment shown in FIG. 4, AC jumper board 220 can be realized as a four layer PCB. Outer layers 401 and 403 can be ground planes coupled to a ground signal on power supply 109 through screws 228 (cf. FIG. 2). Layer stack-up 400 may include inner layers 405 and 407. Accordingly, inner layer 405 can be dedicated to a 'hot' signal, and inner layer 407 can be dedicated to a 'neutral' signal. Furthermore, in some embodiments layer 405 can convey a first AC power signal and layer 407 can convey a second AC power signal. Accordingly, each one of outer layers 401 and 403, and inner layers 405 and 407 may include an electrically conductive material, such as a metal. For example, at least one of layers 401, 403, 405, and 407 may include copper, aluminum, tin, or any other metal or metal alloy. In one embodiment, the weight of inner layers 405 and 407 can be selected in accordance with planned AC current consumption of power supply 109. Relatively standard copper weights can be used when possible, such as ¼ and ½ ounce copper foil weights. If additional current handling capability is required, AC jumper board 220 can include more layers where 'hot' and 'neutral' signal layers can be handled by two or more layers acting in parallel.

FIG. 4 also shows connectors 409 coupling outer layer 401 with outer layer 403. In some embodiments connectors 409 include an electrically conductive material so that a first ground signal conveyed by conductive layer 401 is the same as a second ground signal conveyed by conductive layer 403. In embodiments where connectors 409 extend along a length of jumper board 220, the resulting structure may be shielded from EMI interference and other radio-frequency (RF) interference that may affect the signal conveyed in layers 405 and 407. Likewise, an RF shielding configuration for jumper board 220 may be desirable to avoid interference with RF circuitry outside of jumper board 220 or even outside of power supply 109. Thus, in some embodiments consistent with the present disclosure the connector 409, conductive layer 401, and conductive layer 403 form a radio-frequency (RF) isolating structure.

FIG. 4 shows a medium 450 separating the different layer 401, 403, 405, and 407. In some embodiments, medium 450 may be a dielectric medium. Accordingly, medium 450 may include a high dielectric material acting as an electric insulator between the different layers 401, 403, 405, and 407. In some embodiments, medium 450 may include a polymer, a vinyl, or a plastic having a high dielectric constant, such as used to embed electronic circuitry in PCBs.

FIG. 4 illustrates four distinguishable levels in jumper board 220: level 1, level 2, level 3, and level 4. Each level may include at least one of the first conductive layer 405, the second conductive layer 407, the third conductive layer 401, and the fourth conductive layer 403, and a portion of medium 450. One of ordinary skill may recognize that the number of levels in jumper board 220 may be larger or smaller than the four shown in FIG. 4 for illustrative purposes only.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data which can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. A multilayer printed circuit board (PCB) arranged to distribute alternating current (AC) for a power supply PCB, the multilayer PCB comprising:
   ground layers disposed on opposing surfaces of a dielectric medium that is disposed within a volume defined by the ground layers and radio-frequency (RF) shielding; and
   the RF shielding configured to provide an RF shield for at least one conductive layer that is located between the ground layers and arranged to carry the alternating current, wherein the at least one conductive layer is:
      (i) electrically isolated from the ground layers and RF shielding, and
      (ii) within the volume defined by the ground layers and RF shielding.

2. The multilayer PCB of claim 1, wherein at least one of the ground layers and the at least one conductive layer is made of copper.

3. The multilayer PCB of claim 1, further comprising at least one mounting screw that is (i) made of an electrically conductive material and (ii) electrically coupled to the ground layers.

4. The multilayer PCB of claim 3, wherein opposing ends of the multilayer PCB are each coupled to at least one mounting screw.

5. The multilayer PCB of claim 1, the dielectric medium includes a bottom planar surface that extends parallel to a surface of the power supply PCB.

6. The multilayer PCB of claim 1, wherein the each of the ground layers includes a bottom planar surface that extends parallel to a surface of the power supply PCB.

7. The multilayer PCB of claim 1, wherein the RF shielding, the ground layers, and the at least one conductive layer form a radio-frequency (RF) isolating structure.

8. A power supply for an electric device, comprising:
   an alternating current (AC) input;
   a direct current (DC) output; and
   a multilayer printed circuit board (PCB) comprising:
      a first conductive layer configured to transmit a first AC power signal,
      a second conductive layer configured to transmit a second AC power signal, a third conductive layer configured to transmit a ground signal, and a dielectric layer disposed within a volume defined in part by the third conductive layer, wherein the dielectric layer individually surrounds and electrically isolates each of the first conductive layer and the second conductive layer.

9. The power supply of claim 8, wherein the first conductive layer and the second conductive layer are substantially parallel and planar surfaces.

10. The power supply of claim 8, further comprising an integrated circuit (IC) connected between the multilayer PCB and the DC output.

11. The power supply of claim 8, further comprising a fourth conductive layer configured to convey a second ground signal, wherein the volume is further defined in part by the fourth conductive layer.

12. The power supply of claim 11, further comprising at least a connector electrically coupling the fourth conductive layer with the third conductive layer.

13. The power supply of claim 10, wherein the IC is configured to monitor a current being transmitted between the multilayer PCB and the DC output.

14. An electronic device, comprising:
  a plug for accessing an external source of alternating current (AC);
  a filter coupled to the plug, the filter configured to reduce electromagnetic interference (EMI) occurring at the electronic device; and
  a multilayer printed circuit board (PCB) that is disposed over an area of a circuit of the electronic device and connected to the plug, the multilayer PCB comprising:
    radio-frequency (RF) shielding connected to at least one ground layer to form a perimeter that at least partially encloses a dielectric medium, and
    at least one conductive layer that is (i) electrically isolated from the at least one ground layer and RF shielding, and (ii) at least partially enveloped by the RF shielding, the at least one ground layer, and the dielectric medium.

15. The electronic device of claim 14, wherein the dielectric medium includes a bottom planar surface that extends parallel to the area of the circuit.

16. The electronic device of claim 14, wherein the at least one conductive layer is made of copper.

17. The electronic device of claim 14, further comprising mounting screws made of an electrically conductive material, wherein each of the mounting screws is electrically coupled to the circuit at opposite ends of the multilayer PCB.

18. The electronic device of claim 14, further comprising at least two parallel conductive layers that are at least partially enveloped by the dielectric medium.

19. The electronic device of claim 14, further comprising at least a connector electrically coupling multiple ground layers.

20. The electronic device of claim 14, wherein the RF shielding, the at least one ground layer, and the at least one conductive layer form a radio-frequency (RF) isolating structure.

* * * * *